United States Patent [19]

Dunn et al.

[11] Patent Number: 5,164,328
[45] Date of Patent: Nov. 17, 1992

[54] METHOD OF BUMP BONDING AND SEALING AN ACCELEROMETER CHIP ONTO AN INTEGRATED CIRCUIT CHIP

[75] Inventors: William C. Dunn, Mesa; Brooks L. Scofield, Jr., Tempe, both of Ariz.

[73] Assignee: Motorola, Inc., Schaumburg, Ill.

[21] Appl. No.: 884,314

[22] Filed: May 11, 1992

Related U.S. Application Data

[63] Continuation of Ser. No. 543,003, Jun. 25, 1990, abandoned.

[51] Int. Cl.[5] .................. H01L 21/56; H01L 21/58; H01L 21/60
[52] U.S. Cl. .......................... 437/54; 437/211; 437/213; 437/915; 437/927; 73/517 R; 73/777
[58] Field of Search ............... 357/25; 437/7, 915

[56] References Cited

U.S. PATENT DOCUMENTS

| | | | |
|---|---|---|---|
| 3,811,183 | 5/1974 | Celling | 437/211 |
| 4,001,586 | 1/1977 | Fraioli | 250/345 |
| 4,129,042 | 12/1978 | Rosvold | 73/727 |
| 4,525,766 | 6/1985 | Peterson | 174/52.4 |
| 4,797,723 | 1/1989 | Nishimura et al. | 437/915 |
| 4,829,818 | 5/1989 | Bohrer | 73/204.22 |
| 4,847,210 | 7/1989 | Hwang et al. | 357/55 |
| 4,926,231 | 5/1990 | Hwang et al. | 357/49 |
| 4,942,140 | 7/1990 | Ootsuki et al. | 437/211 |
| 4,945,765 | 8/1990 | Roszhart | 73/517 |

FOREIGN PATENT DOCUMENTS

| | | | |
|---|---|---|---|
| 57-130437 | 8/1982 | Japan | 437/211 |
| 57-130438 | 8/1982 | Japan | 437/211 |
| 59-143333 | 8/1984 | Japan | 437/211 |
| 59-144146 | 8/1984 | Japan | 437/211 |
| 60-47430 | 3/1985 | Japan | 437/211 |
| 63-239826 | 10/1988 | Japan | 437/211 |
| 63-307746 | 12/1988 | Japan | 437/211 |
| 1-134938 | 5/1989 | Japan | 437/211 |

OTHER PUBLICATIONS

Microelectronic Packaging Handbook, Van Nostrand Reinhold, 1989, pp. 727, 747, 751, 762 and 763.
Allen, Roger: "Sensors in Silicon", High Technology, Sep. 1984, pp. 43-50.
IBM Technical Disclosure Bulletin: vol. 32, No. 10B, Mar. 1990, p. 480.

Primary Examiner—Olik Chaudhuri
Assistant Examiner—David E. Graybill
Attorney, Agent, or Firm—Joe E. Barbee

[57] ABSTRACT

A method of joining an integrated circuit die (10) and a sensor die (11) by the use of solder bumps (12) for the formation of a hybrid circuit assembly. Sensor die (11) and integrated circuit die (10) are manufactured separately from each other. These two components are then joined by at least one solder bump to make a hybrid circuit assembly. A dielectric sealant (21) is deposited around the outside edges of sensor (11) to prevent foreign material such as encapsulating material from interfering in the operation of the sensor. The hybrid circuit assembly is encapsulated in a plastic material (14).

9 Claims, 1 Drawing Sheet

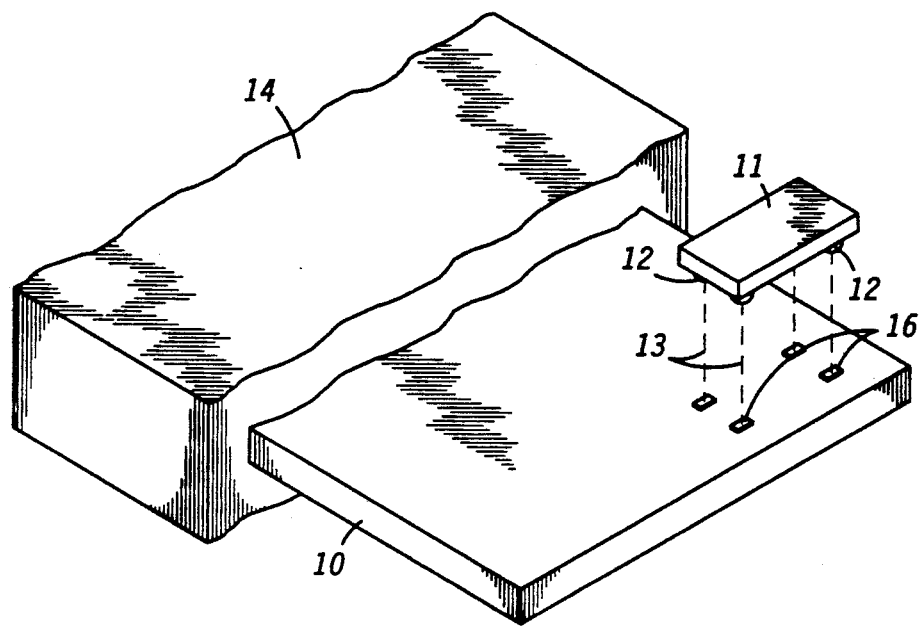
FIG. 1
FIG. 2
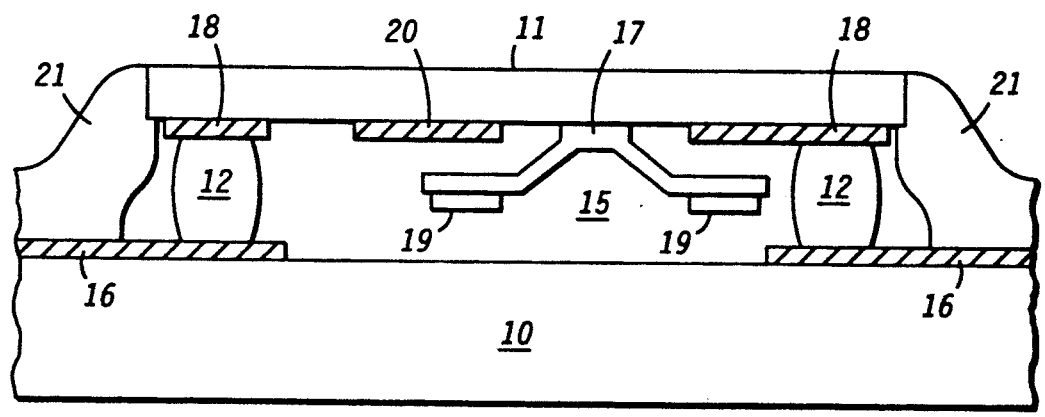

METHOD OF BUMP BONDING AND SEALING AN ACCELEROMETER CHIP ONTO AN INTEGRATED CIRCUIT CHIP

This application is a continuation of prior application Ser. No. 07/543,003, filed Jun. 25, 1990, now abandoned.

BACKGROUND OF THE INVENTION

This invention relates, in general, to assembling semiconductor devices, and more particularly, to mating of at least one sensor die to an integrated circuit by the use of solder bumps.

The most common method of manufacturing sensors today is bulk micro-machining. Bulk micro-machining is an expensive process with the added cost of assembling these sensors into other electronic components. Sensors that are bulk micro-machined are usually packaged in costly ceramic packages that are hermetically sealed. The use of surface micro-machining for manufacturing sensors is far more cost effective.

Generally, these micro-machined solid-state sensors and an associated integrated circuit have been built as two separate entities and are then connected via circuit boards, wires, and the like. This method consumes large amounts of space and is relatively expensive to assembly. Therefore, a method that enables the direct mating of a sensor and integrated circuit which will reduce the amount of space, increase the reliability due to less assembly errors and thereby lower cost becomes highly desirable.

SUMMARY OF THE INVENTION

The objects and advantages of the present invention are provided by the formation of a hybrid circuit assembly consisting of a sensor and an integrated circuit joined together by at least one solder bump. The sensor which is joined to an integrated circuit is sealed by use of a dielectric which surrounds the outside edges of the sensor. This dielectric provides protection from any surrounding environment. The hybrid circuit assembly is then encapsulated with an encapsulating material.

In a preferred embodiment, the sensor is an accelerometer having at least one moveable portion.

BRIEF DESCRIPTION OF THE DRAWINGS

FIG. 1 is a simplified exploded view, with a portion cut-away, of an embodiment of the present invention; and FIG. 2 is an enlarged cross-sectional view of a portion of the embodiment of FIG. 1.

DETAILED DESCRIPTION OF THE DRAWINGS

A cross-sectional view of a hybrid circuit assembly is illustrated in FIG. 1. The hybrid circuit assembly has an integrated circuit substrate 10 which is greatly simplified for purposes of illustration. It should be understood that integrated circuit substrate 10 has a multiplicity of active and/or passive devices which could work independently or in concert with a sensor device or die 11. Sensor die 11 is shown in an elevated position above integrated circuit 10 to facilitate illustrating the present invention. This view reveals a plurality of bonding sites or contact pads 16 on integrated circuit 10 that will mate with sensor die 11 by solder bumps 12. The elevation of sensor die 11 is shown by a set of dotted lines 13 positioned so as to indicate alignment relationship of sensor die 11, solder bumps 12, and integrated circuit 10. It should be apparent that positioning sensor die 11 in relation to integrated circuit 10 is an important step. If this step is not accomplished successfully the signal communication between sensor 11 and integrated circuit 10 will be impaired.

The hybrid assembly is encapsulated with a plastic material 14. A portion of plastic material 14 is shown cut away to better illustrate the interconnection of integrated circuit 10 and sensor 11. Ihe plastic material which is used to encapsulate integrated circuit 10 could be any number of materials such as a liquid polyester thermoset or the like. For the purposes of simplicity it should be realized that the connections from integrated circuit 10 to other circuitry are not shown and that it is not necessary for an understanding of the present invention. It should be well understood by anyone skilled in the art that integrated circuit substrate 10 and sensor 11 can be any one of a variety of circuits and sensors. Sensor 11 can be an accelerometer, pressure sensor, airflow sensor, etc.

FIG. 2 illustrates an enlarged cross-sectional view of integrated circuit 10 and sensor 11. For illustrative purposes sensor 11 is shown as an accelerometer. It should also be understood by someone knowledgeable in the art that not only could different types of accelerometers be used but, also different types of sensors as well. By way of example only, one type of cantilevered accelerometer 11 is disclosed in U.S. Pat. No. 4,736,629 which issued to John Cole on Apr. 12, 1988 and is hereby incorporated herein by reference.

Accelerometer 11 is inverted and positioned so that solder bumps 12 on sensor 11 make electrical contact with contact pads 16 on substrate of integrated circuit 10. It should be realized that solder bumps 12 can be on either sensor 11 or integrated circuit 10. Also, the metallization of contact 16 and/or contact 18 can be increased in thickness to replace bump 12, and thus form a direct metallurgical bond between metallization 16 and 18. The edges of sensor die 11 define the perimeter of a cavity 15 while the height of cavity 15 is defined by solder bumps 12, contact pad 16 on integrated circuit 10, and contact pad 18 on sensor die 11. It should be understood that capacitor plate 20 and contact pad 18 are electrically continuous. Contact pad 18 is therefore capable of being positioned in such a manner that design advantages may be realized. This cavity 15 can contain sensing capacitors and cantilever beams 17, and the like. Space that cavity 15 provides is important in illustrated accelerometer 11 so that free movement of cantilever beams 17 can take place in response to acceleration. It is well know in the art that a mass 19 can be used to facilitate the movement of cantilever beams 17 in response to acceleration. It should be further understood that mass 19 can be composed of many different materials, one such embodiment is discussed in further detail in U.S. Pat. No. 4,736,629; however a preferred embodiment is to use polysilicon as mass 19. Substrate of sensor or accelerometer 11 serves as a mechanical stop for cantilever beams 17 as does the substrate of integrated circuit 10. This feature protects cantilever beams 17 from excessive movement in response to severe acceleration which could result in the damaging of cantilever beams 17. This feature therefore, allows sensor device 11 to be used repeatedly even after sensor device 11 has experienced acceleration past the designed limits of sensor device 11.

A dielectric sealant 21 is used to protect the sensitive parts of the accelerometer and the like from the environment in order to prevent foreign matter from interfering with the free movement of cantilever beams 17. Sealant 21 effectively isolates the sensitive parts of cavity 15 from contaminants in the environment; and more importantly, prevents encapsulating material from entering cavity 15. Sealant 21 can be composed of many different dielectric materials such as frit glass, epoxy or the like. Frit glass is applied as a paste which upon firing melts and forms a sealant.

By now it should be appreciated that there has been provided an improvement in the manner in which integrated circuits and sensing devices are joined together. The hybrid circuit assembly enables the joining of a sensor and an integrated circuit directly together in a low cost plastic package. This then eliminates much of the handling that was necessary which ultimately results in increased reliability and lower cost of assembling. A further advantage of using this invention is the opportunity to use generic electronics for many different sensor types. The use of generic electronics also results in cost savings.

We claim:

1. A method of joining an accelerometer on an integrated circuit chip, comprising:
    providing the accelerometer having a solid first surface and a second surface;
    positioning the accelerometer on the integrated circuit and making an electrical contact between the accelerometer and the integrated circuit by solder bumps located between the second surface and the integrated circuit; and
    applying a dielectric sealant along edges of the accelerometer, sealing te accelerometer to the integrated circuit chip, thereby protecting a functional area of the accelerometer from any surrounding environment.

2. The method of claim 1 wherein the sealing is done by using a frit glass and then firing the frit glass.

3. The method of claim 1 wherein teh sealing is done by using an epoxy.

4. The method of claim 1 wherein te sealing is done by using an elastomer.

5. A method of mounting an accelerometer die having an undivided surface on an integrated circuit chip, comprising:
    using metal bumps for making electrical contact to the accelerometer and defining a functional area;
    aligning the accelerometer in an inverted position such that the metal bumps make electrical contact with the integrated circuit; and
    sealing around edges of the accelerometer sothat a functional area of the accelerometer is isolated from any surrounding environment.

6. The method of claim 5 wherein the sealing is done by using a frit glass.

7. A method of joining an accelerometer having an undivided top surface and a bottom surface to an integrated circuit chip, wherein portions of the accelerometer move in response to acceleration, the accelerometer being joined to the integrated circuit by solder bumps which will conduct signals from capacitor plates on the bottom surface of the accelerometer to the integrated circuit, the method comprising:
    aligning the accelerometer in such a manner so that the solder bumps come into electrical contact with the integrated circuit; and
    sealing around edges of the accelerometer thereby holding the accelerometer in a fixed relationship to the integrated circuit while providing space between the accelerometer and the integrated circuit chip for the portion which moves to have an area in which it can move.

8. The method of claim 7 further including teh step of encapsulating the integrated circuit chip and the accelerometer.

9. A method of packaging an accelerometer in combination with an integrated circuit, comprising:
    providing an accelerometer with an undivided first surface and a second surface having at least one solder bump on the second surface for making electrical contact to the accelerometer;
    mounting the accelerometer on the integrated circuit chip in a manner so that the solder bump provides electrical contact between the second surface of the accelerometer and the integrated circuit chip;
    sealing around the accelerometer; and
    encapsulating the accelerometer and the integrated circuit chip.

* * * * *

UNITED STATES PATENT AND TRADEMARK OFFICE
CERTIFICATE OF CORRECTION

PATENT NO. : 5,164,328
DATED : November 17, 1992
INVENTOR(S) : William C. Dunn et al.

It is certified that error appears in the above-indentified patent and that said Letters Patent is hereby corrected as shown below:

Claim 1, column 3, line 37 "te" should read --the--.
Claim 3, column 3, line 44 "teh" should read --the--.
Claim 4, column 3, line 46, "te" should read --the--.
Claim 5, column 4, line 9, "sothat" should read --so that--.
Claim 8, column 4, line 31, "teh" should read --the--.

Signed and Sealed this

Eleventh Day of October, 1994

Attest:

BRUCE LEHMAN

Attesting Officer

Commissioner of Patents and Trademarks